(12) United States Patent
Krause et al.

(10) Patent No.: US 7,041,436 B2
(45) Date of Patent: May 9, 2006

(54) METHOD FOR THE MANUFACTURE OF MICRO STRUCTURES

(75) Inventors: Rainer Klaus Krause, Kostheim (DE); Markus Schmidt, Seibersbach (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,426

(22) Filed: Dec. 12, 2003

(65) Prior Publication Data

US 2005/0130074 A1    Jun. 16, 2005

(30) Foreign Application Priority Data

Dec. 13, 2002  (EP) .................................. 02027971

(51) Int. Cl.
*G03F 7/00*   (2006.01)

(52) U.S. Cl. ........................ 430/322; 430/325; 430/396
(58) Field of Classification Search ................ 430/320, 430/322, 325, 396; 360/126
See application file for complete search history.

(56) References Cited

U.S. PATENT DOCUMENTS

| | | | |
|---|---|---|---|
| 5,837,426 A | | 11/1998 | Tseng |
| 5,901,432 A | * | 5/1999 | Armstrong et al. ...... 29/603.14 |
| 6,042,993 A | | 3/2000 | Leuschner |
| 6,653,030 B1 | * | 11/2003 | Jeans et al. .................... 430/5 |
| 2001/0022704 A1 | * | 9/2001 | Hong .......................... 360/126 |

* cited by examiner

*Primary Examiner*—John A. McPherson
(74) *Attorney, Agent, or Firm*—Joseph P. Abate

(57) ABSTRACT

Method for the Manufacture of Micro Structures A method for the manufacture of micro structures in substrates is provided. The method uses a combination of photolithographic mask technology and micro contact printing.

4 Claims, 4 Drawing Sheets

METHOD FOR THE MANUFACTURE OF MICRO STRUCTURES

BACKGROUND OF INVENTION

The present invention relates in general to photolithographic processes. Specifically, the present invention is concerned with a process for the manufacture of metallic structures in a substrate having narrow dimensions.

In semiconductor technology and in microelectronics, the dimensions of structures are becoming smaller and smaller. In memory production today, e.g., structures with a width of less than 200 nm are produced using optical lithography in combination with the masking technique. Photolithographic processes are vital steps in the fabrication of, e.g., semiconductor devices. In a photolitho-graphic process, an exposure light, usually ultraviolet (UV) light is used to expose a photoresist-coated semiconductor wafer through a mask (in the following called photomask). The purpose of the photolithographic process is to transfer a set of patterns representative of the circuit layer onto the wafer. The patterns on the photomask define the positions, shapes and sizes of various circuit elements such as diffusion areas, metal contacts and metallization layers, on the wafer.

In optical lithography a limit can be expected at approximately 70 nm because of diffraction effects.

However, structures with even smaller dimensions are required for new applications such as single-electron transistors or molecular electronic components. In the case of very high-frequency circuits this is also true in conventional electronics. There is also a need to reduce, e.g., the read and write dimensions in thin film magnetic heads. In addition to that, micro structures having a very high aspect ratio of about 5 to 30 and greater will be needed.

Today's photolithographical techniques are still restricted by the wavelength of the used exposure light to arrive at critical dimensions as small as possible. Reduction of the critical dimensions was done in most cases by the reduction of the wavelength of radiation, i.e., starting with UV exposure and proceeding to DUV exposure, electron radiation and X-rays. X-ray lithography, e.g., makes it possible to image dimensions of less than 100 nm. In electron and ion beam lithography, structures as small as 10 nm can be generated with high-energy particles. However, this requires expensive vacuum systems and beam guidance systems. In addition, problems can occur with sensitive components due to radiation damage in the substrate, because the high-energy particles can penetrate through the resist layers required for etching processes.

U.S. Pat. No. 5,837,426 discloses a photolithographic process which provides reduced line widths or reduced interelement line spaces for the circuit elements on an IC chip, allowing the IC chip to have a higher degree of integration. This photolithographic process includes a double-exposure process on the same wafer defined by placing either the same photomask at two different positions or by using two photomasks.

In U.S. Pat. No. 6,042,993 a photolithographic structure generation process for structures in the sub-200 nm range is disclosed wherein a layer of amorphous hydrogen-containing carbon with an optical energy gap of <1 eV or a layer of sputtered amorphous carbon is applied as the bottom resist to a substrate; the bottom layer resist is provided with a layer of an electron beam-sensitive silicon-containing or silylatable photoresist as the top resist; the top rsist is then structured by means of scanning tunneling microscopy (STM) or scanning force microscopy (SFM) with electrons of an energy of $\leq 80$ eV; and the structure is subsequently transferred to the bottom resist by etching with an anisotropic oxygen plasma and is next transferred to the substrate by plasma etching.

On the other hand, printing from a patterned surface to thin layers of material is a well known and well documented process in printing industry.

Printing processes were originally developed for the exchange and storage of information adapted to human vision. This field of application requires pattern and overlay accuracies down to 20 µm for high-quality reproduction. In a few cases, printing processes have been used for technological patterning, e.g., gravure offset printing was used to make 50-µm-wide conductor lines on ceramic substrates, and to pattern thin-film transistors for low-cost displays. Offset printing was used for the fabrication of capacitors and printed and plated metal lines as narrow as 25 µm. Finally, printed circuit boards and integrated circuit packaging are popular applications of screen printing in the electronics industry. (B. Michel et al., IBM J. Res. Develop. 45, 697 (2001) and references therein).

In a process known as flexography, viscous ink is printed onto porous paper and permeable plastic. Flexography is a direct rotary printing method that uses resilient relief image plates of rubber or other resilient materials including photopolymers to print an image on diverse types of materials that are typically difficult to image with traditional offset or gravure processes, such as cardboard, plastic films and virtually any type of substrate whether absorbent or non-absorbent. As such it has found great applications and market potential in the packaging industry. Usually, the viscous ink prevents a direct contact of the stamp with the substrate because it cannot be displaced quickly enough during the fast printing operations. The transfer of a thick layer of ink is desired in this typical mode of operation but also prevents replication of laterally small features—this is the main reason why printed feature sizes cannot be smaller than 20 µm. Printing onto metal foils has been implemented in a few applications but is much more difficult than other processes (H. Kipphan, "Handbuch der Printmedien", Springer Berlin, 2000 and J. M. Adams, D. D. Faux, and J. J. Rieber, "Printing Technology 4th Ed.", Delamare Publishers, Albany, N.Y.).

Microcontact printing uses a similar stamp as flexography does, but typically transfers a monolayer of ink onto an impermeable metal surface. A more general process now called soft lithography is successfully applied in different variants to print thiols and other chemicals to a wide variety of surfaces. Typically, the chemicals are first applied to the patterned stamp surface as solutions in a volatile solvent or using a contact inker pad. After inking and drying, the molecules are present in the bulk and on the surface of the stamp in a "dry" state and are transferred to the surface by a mechanical contact. Reasons for the choice of poly-(dimethyl)siloxane (PDMS) as the stamp material are its good rubber-like elasticity, a chemistry similar to glass, the possibility to buffer ink molecules, and—very important—its excellent gas permeability that enables small amounts of air to dissolve into or escape through the stamp matrix. (cf. B. Michel et al. "Printing meets lithography", IBM, J. Res. Develop. 45 (5), 697 (2001)).

Since, as already pointed out above, processing of narrow dimensions, i.e., dimensions <0.15 µm, like future P2 width on wafers for standard magnetic recording heads using photolithography technology requires at least Extreme UV (EUV) or e-beam techniques followed by image transfer, there is a need for less expensive and, on the other hand, more robust techniques for fabricating narrow dimension structures on substrates. Additionally, there is a need for such structures that provide better distributions. Distribution of critical dimensions (CD) drives device performance and manufacturing yield and quality. In lithography, distribution depends on the tool, e.g., optics, flash fields, alugnment, etc., as well as the wafer surface flatness and process handling

SUMMARY OF INVENTION

It is therefore an object of the present invention to provide a method for the reduction of the widths of trench structures on substrates.

It is a further object of the invention to provide such structures having a very high aspect ratio.

It is still a further object of the present invention to provide such a process that can be easily integrated into existing procedures.

These and other objects and advantages are achieved by the method disclosed in claim 1.

Advantageous embodiments of the invention are disclosed in the dependent claims.

DETAILED DESCRIPTION

The proposed technology is a combination of mask photolithography and micro contact printing in order to produce metallic structures on a substrate, these structures having narrow dimensions and a very high aspect ratio, like, e.g., write pole and sensor on magnetic recording heads (thin film technology), MD trenches for capacitors and any other kind of narrow trenches used in Thin Film Technology (TFT), MD or micromechanics.

In the following, the invention will be described in more detail with respect to the formation of a P2 structure on wafers for standard magnetic recording heads. However, it has to be mentioned that the invention is not restricted to such a special process, but can be used to manufacture narrow dimensions on every substrate.

In manufacturing the P2 structure, the method according to the invention is used to stamp the necessary critical dimension geometry into the resist layer on top of the planarized layer, in the present case the write gap. In order to achieve an appropriate throughput, a multiple stamp array, like, e.g., a flash field, can be used. According to the invention, a P2 structure or microstructure having an aspect ratio in a range of 1:5 to 1:20 is achievable.

The process starts with providing a photolithographical mask. As can be taken from FIG. 1, a process mask 10 is provided, where compensation area for plating is covered with a metal layer 12, e.g., chromium, and the area 14 where the P2 structure is to be created is left free. Compensation area is required to achieve homogeneous material distribution at plating.

Figure 2:
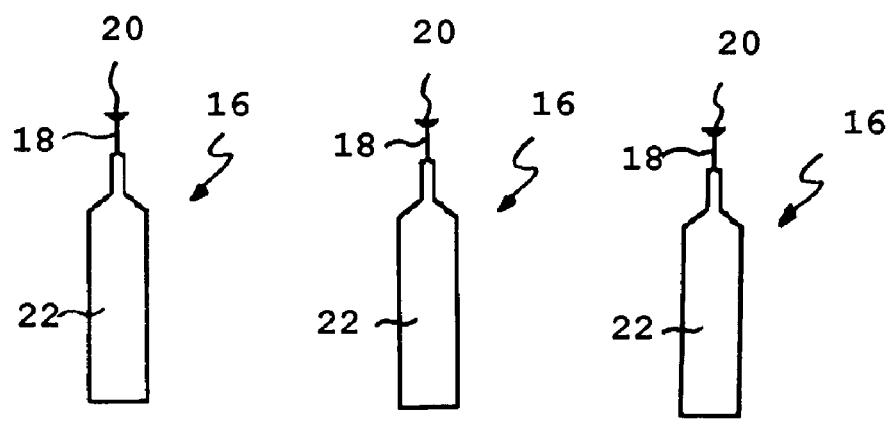
FIG. 2 schematically shows a cross-sectional view of the soft stamps used in the method of the invention.

Next, as shown in FIG. 2, soft stamps 16 arranged in a soft stamp array are created from a master using standard mold technology as, e.g., disclosed in B. Michel, "Printing meets lithography: soft approaches to high-resolution patterning"; IBM J. Res. Develop., 45 (5), 697 (2001). Advantageously, the stamps are made of poly-(dimethyl) siloxane (PDMS). The design of the soft stamps 16 shows a small area 18 of critical dimension, made of PDMS or a material with equivalent mechanical properties, mechanically stabilized by two greater holding blocks 20, 22, made as well from PDMS or an equivalent material. The holding blocks stabilize the narrow device to prevent it from bending during stamping. The aspect ratio for the holding block should be in the range of 1:1 down to 1:2 in order to achieve maximum stability.

Figure 1:
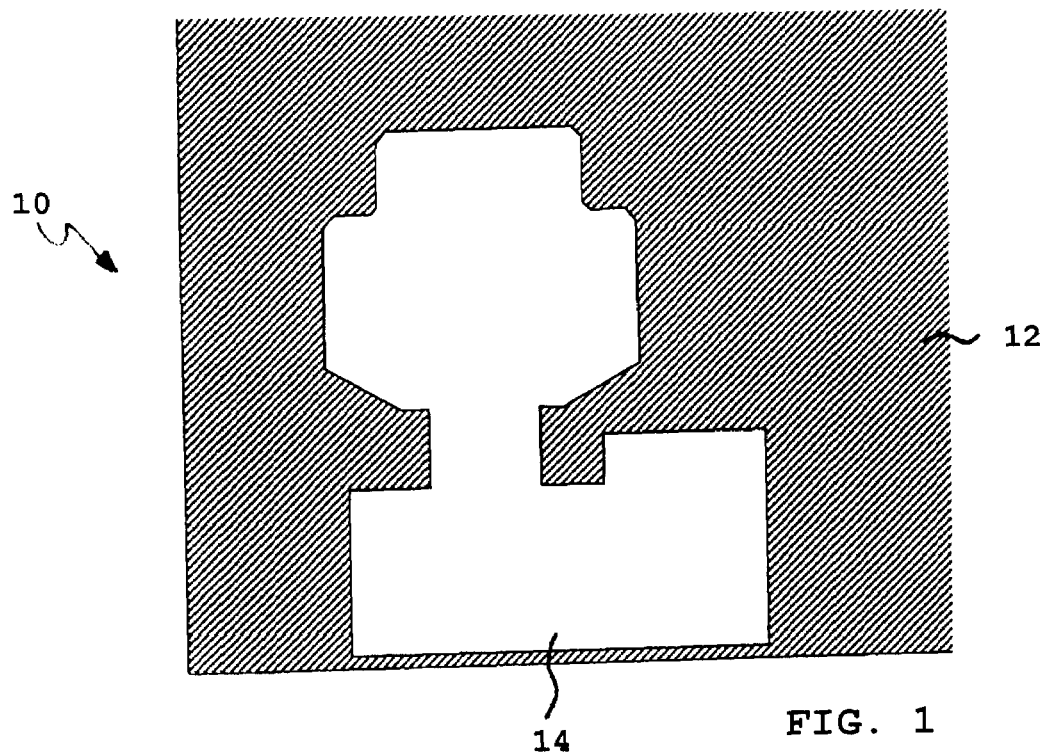
FIG. 1 schematically depicts a process mask for the processing of the P2 structure on wafers for standard magnetic recording heads.
Figure 3:
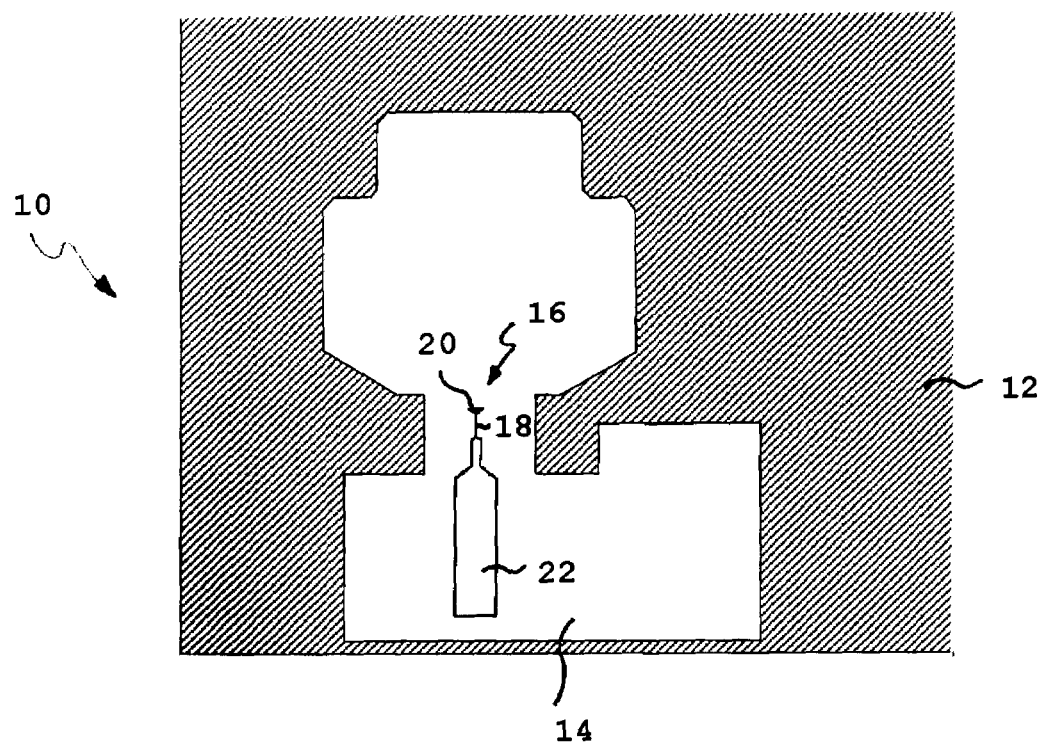
FIG. 3 schematically depicts the process mask of FIG. 1 with the soft stamp of FIG. 2 in place.

FIG. 3 is a top down view of the process mask of FIG. 1 with the soft stamp of FIG. 2 in place. The stamp 16 is placed within the area 14 that will be exposed to light (P2 structure) but not stamped, such that the microstructure 18, in the present case the write gap for the magnetic head, is exactly positioned and aligned.

Figure 4:
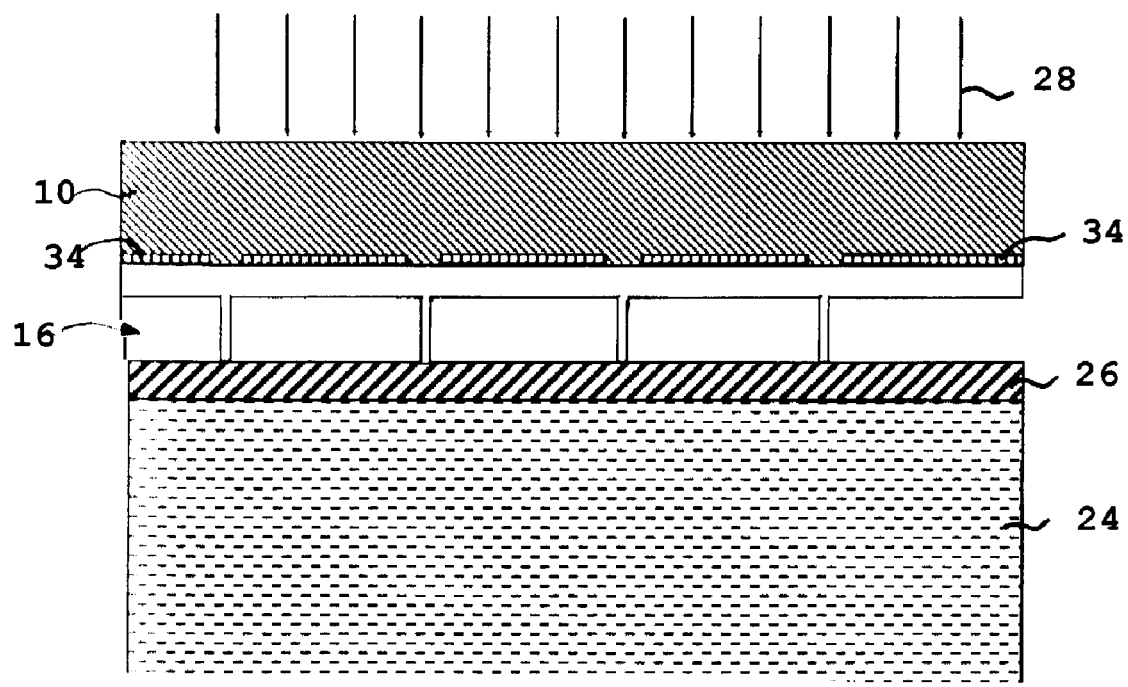
FIG. 4 schematically depicts the mask and the soft stamp arranged on the substrate to be processed.

FIG. 4 schematically depicts the next process step. The soft stamp array 16 is attached to the mask 10, a quartz base plate, having, e.g., chromium portions 34 where no exposure is to take place, thereby enabling stamp alignment using piezo actuator technology, as, e.g., described in D. L. White et al., "Novel Alignment System for Imprint Lithography", J. Vac. Sci. Technol. B, Microelectron. Nanometer Struct. (USA), vol. 18, no. 6, November 2000, pp. 3552–6. The soft stamps 16 being attached to the mask 10 are placed on the substrate 24 to be processed. The substrate 24 is provided with a resist layer 26. Subsequently, the pattern is stamped into the resist layer 26 at the P2 location and is then cured by exposing to UV light 28.

Figure 5:
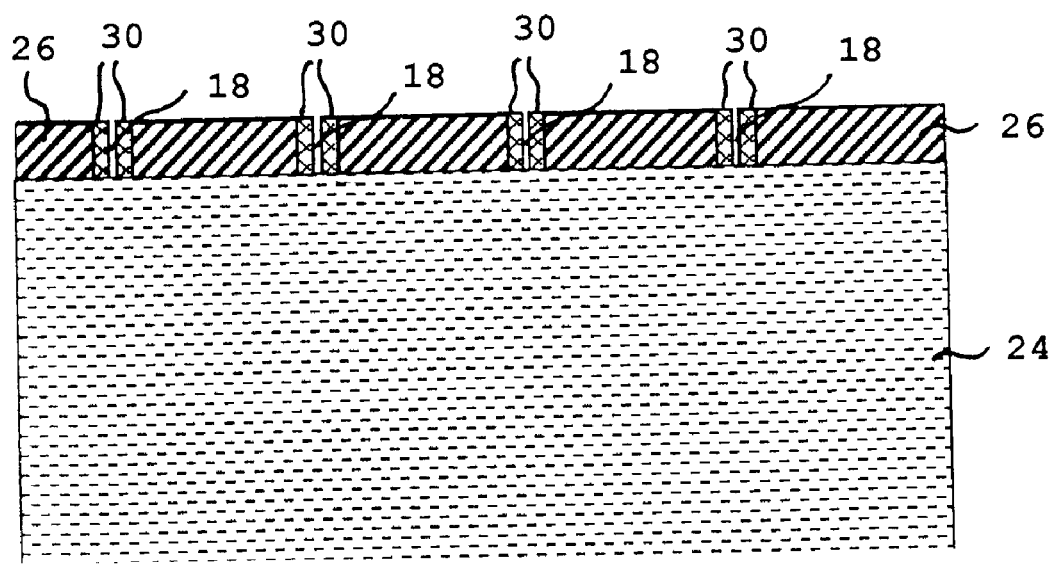
FIG. 5 schematically shows the cured areas around the P2 structure after stamp removal.

FIG. 5 schematically depicts the surface of substrate 24, showing the cured areas 30 around the P2 structure after removal of the stamp.

Figure 6:
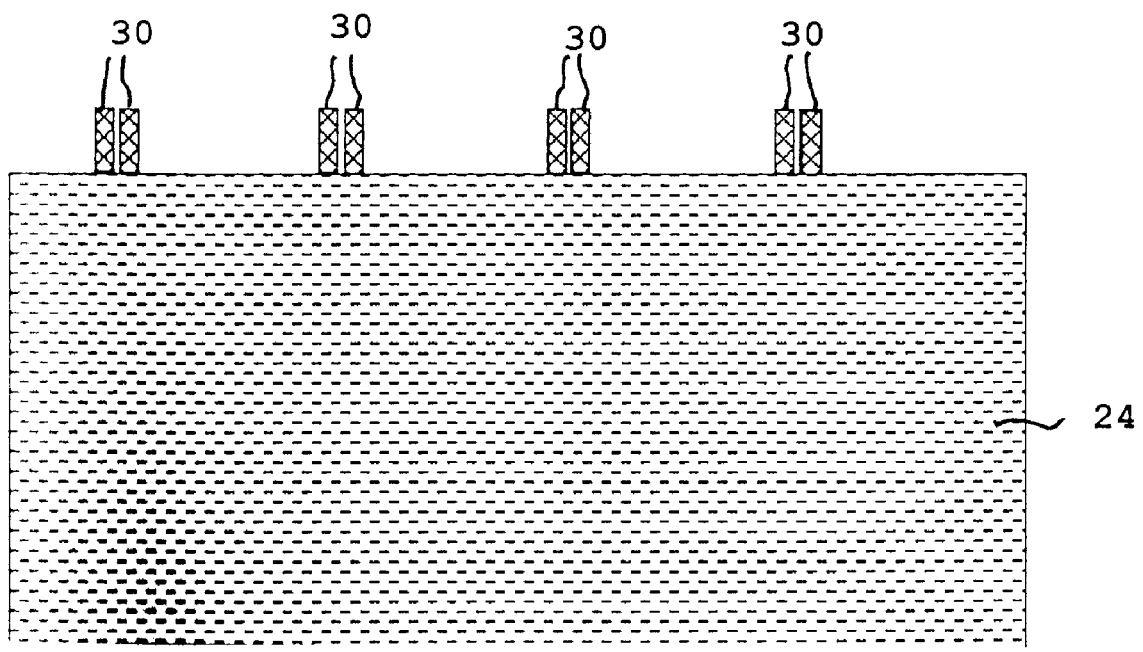
FIG. 6 schematically depicts the areas around the P2 structure after the resist has been developed.

Subsequently, the resist layer 26 is developed to remove unexposed resist area, i.e., plating compensation area. The resulting structure is schematically shown in FIG. 6.

Figure 7:
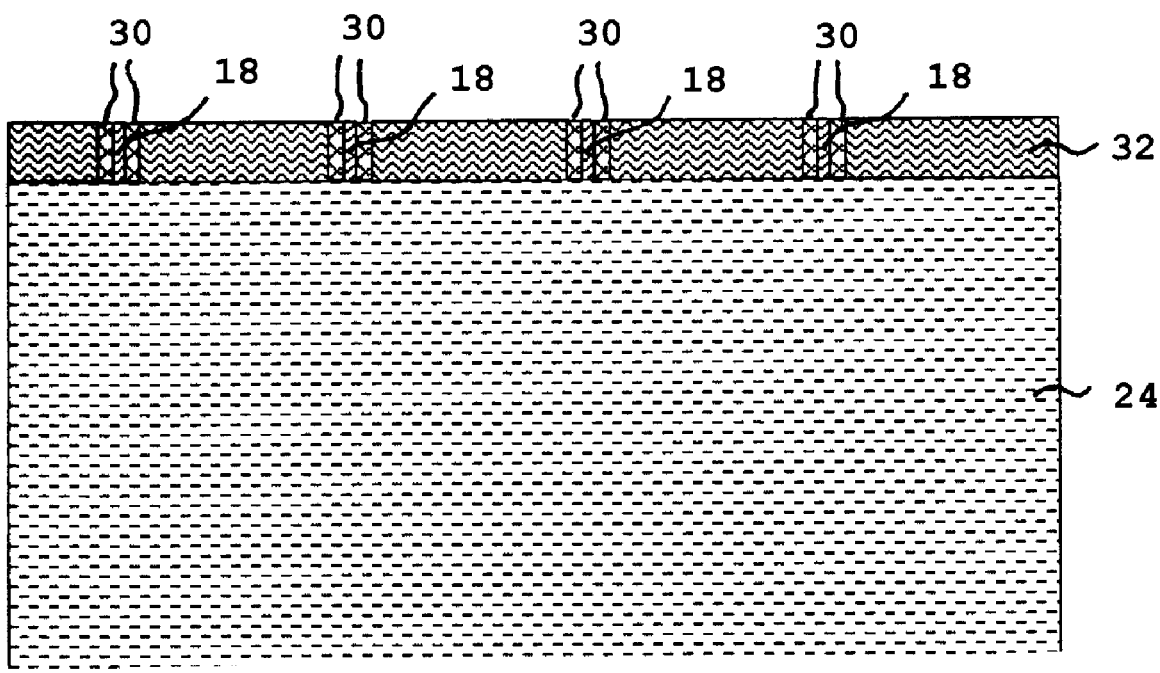
FIG. 7 schematically shows the areas around the P2 structure after a plating process.

Finally, as shown in FIG. 7, the substrate 24 is plated with a layer 32 of NiFe.

In order to finish the write pole structure (P2-structure), the standard P2-process is followed up.

By using the process according to the invention, narrow dimensions can be achieved, having aspect ratios in the area of from about 1:5 to about 1:15, covering the full range. This process is not only less expensive, but also more robust due to reproducible dimensions, less alignment issues, the combined stamping and exposure process which provides for better distributions. Small trenches can be manufactured repeatedly and edge effects on the wafer, due to flatness variation, can be minimized if not eliminated.

A further advantage of the method according to the present invention is the fact that very fine structures can be realized next to coarse structures in the same layer. The coarse structure can subsequently be subjected to further lithographic treatment.

The invention claimed is:
1. A method for the manufacture of microstructures in substrates, comprising the steps of
   a) providing a process mask (10);
   b) creating soft stamps (16) from a master comprising a microstructure (18) having an aspect ratio in a range of 1:5 to 1:20, said step of creating including creating holding blocks (20, 22) attached to said microstructure (18), each of said holding blocks having an aspect ratio in a range of 1:1 to 1:2 so as to stabilize said microstructure (18) mechanically;
   c) attaching said soft stamps (16) to said mask (10);
   d) stamping a desired pattern into a resist layer (26) provided on a substrate (24) to be processed; and
   e) curing said pattern with UV light.

2. The method according to claim 1, wherein said mask (10) comprises a plating compensation area.

3. The method according to claim 2, wherein said plating compensation area is coversd with a metallic layer (12).

4. The method according to claim 3, wherein said metal is chromium.

* * * * *